(12) United States Patent  
Kim et al.

(10) Patent No.: US 8,647,916 B2
(45) Date of Patent: Feb. 11, 2014

(54) METHOD FOR MANUFACTURING SOLAR CELL USING A SINGLE TARGET

(75) Inventors: Kyung Hyun Kim, Daejeon (KR); Je Ha Kim, Daejeon (KR); Hae-won Choi, Daegu (KR); Dae-Hyung Cho, Seoul (KR); Yong-Duck Chung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/530,370

(22) Filed: Jun. 22, 2012

(65) Prior Publication Data

US 2013/0095600 A1 Apr. 18, 2013

(30) Foreign Application Priority Data

Oct. 17, 2011 (KR) .................. 10-2011-0106020

(51) Int. Cl.
*H01L 21/00* (2006.01)
(52) U.S. Cl.
USPC ............... 438/87; 257/E31; 257/61; 136/256
(58) Field of Classification Search
USPC ................. 438/87; 257/E31.061; 136/256
See application file for complete search history.

(56) References Cited

U.S. PATENT DOCUMENTS

| | | | |
|---|---|---|---|
| 4,611,091 A * | 9/1986 | Choudary et al. ............ 136/260 |
| 4,612,411 A * | 9/1986 | Wieting et al. ................ 136/265 |
| 5,078,804 A * | 1/1992 | Chen et al. .................... 136/260 |
| 2003/0150485 A1* | 8/2003 | Koyanagi et al. ............ 136/256 |
| 2005/0000564 A1* | 1/2005 | Sato et al. ..................... 136/256 |
| 2005/0109392 A1* | 5/2005 | Hollars ......................... 136/265 |
| 2009/0014065 A1* | 1/2009 | Mueller et al. ............... 136/256 |
| 2009/0165850 A1* | 7/2009 | Saita et al. .................... 136/256 |
| 2010/0089444 A1* | 4/2010 | Thomsen et al. ............ 136/256 |
| 2010/0319777 A1* | 12/2010 | Bae et al. ..................... 136/262 |
| 2011/0017289 A1* | 1/2011 | Park et al. .................... 136/256 |
| 2011/0126875 A1* | 6/2011 | Le et al. ....................... 136/244 |
| 2011/0226320 A1* | 9/2011 | Little et al. ................... 136/256 |
| 2011/0259418 A1* | 10/2011 | Hollars ......................... 136/256 |
| 2012/0031459 A1* | 2/2012 | Kim et al. .................... 136/244 |

OTHER PUBLICATIONS

Joel N. Duenow et al., "Investigation of ZnO:Al Doping Level and Deposition Temperature Effects on CIGS Solar Cell Performance", Mater. Res. Soc. Symp. Proc. May 15, 2007, 1012Y01-08 (6 pages), vol. 1012.

* cited by examiner

*Primary Examiner* — Kimberly Rizkallah
*Assistant Examiner* — Caleb Henry
(74) *Attorney, Agent, or Firm* — Rabin & Berdo, P.C.

(57) ABSTRACT

Methods for manufacturing a solar cell are provided. The method may include forming a lower electrode on a substrate, forming a light absorption layer on the lower electrode, forming a buffer layer on the light absorption layer, and forming a window layer on the buffer layer. The window layer may include an intrinsic layer and the transparent electrode which have electric characteristics different from each other, respectively. The intrinsic layer and the transparent electrode may be formed by a sputtering process using a single target formed of metal oxide doped with impurities.

8 Claims, 4 Drawing Sheets

METHOD FOR MANUFACTURING SOLAR CELL USING A SINGLE TARGET

CROSS-REFERENCE TO RELATED APPLICATIONS

This U.S. non-provisional patent application claims priority under 35 U.S.C. §119 to Korean Patent Application No. 10-2011-0106020, filed on Oct. 17, 2011, the entirety of which is incorporated by reference herein.

BACKGROUND

The inventive concept relates to methods for manufacturing a solar cell and, more particularly, to methods for manufacturing a solar cell including a window layer.

Copper-indium-gallium-selenium (CIGS) thin film solar cells may be higher in efficiency than amorphous silicon solar cells. Additionally, an initial deterioration phenomenon may not occur in the CIGS thin film solar cells, such that these may have a relatively high stability. Thus, various techniques have been developed for commercialization of the CIGS thin film solar cells. The CIGS thin film solar cells may be replaced with single-crystal solar cells because of lightness and high efficiency thereof. The CIGS thin film solar cells may be capable of being used in space. The CIGS thin film solar cells may have the electricity generation amount per unit weight of about 100 W/kg. Thus, the CIGS thin film solar cells may have more excellent efficiency than silicon or GaAs solar cells having the electricity generation amount per unit weight of about 20 W/kg to about 40 W/kg. Currently, the CIGS thin film solar cells may have the efficiency of about 20.3% in a single junction structure. Thus, the CIGS thin film solar cells may have a capacity substantially equal to the maximum efficiency (e.g., about 20%) of an existing poly-crystalline silicon solar cells.

In spite of the above advantages, the CIGS thin film solar cells may have low productivity. Since CIGS thin film solar cells may be generally formed through various steps of vacuum processes, the CIGS thin film solar cells may have high manufacture cost and low mass productivity characteristics. The CIGS thin film solar cell may include a lower electrode, a light absorption layer, and a window layer that are sequentially stacked on a substrate. The window layer may include an intrinsic layer having high resistance and a transparent electrode having high electric conductivity. Generally, the window layer may be formed by a sputtering process using a plurality of targets corresponding to materials of the intrinsic layer and the transparent electrode respectively having electric characteristics different from each other. A sputtering apparatus may include a plurality of targets and a plurality of sputtering guns accelerating plasma ions to the plurality of targets when the window layer is formed. Thus, in a conventional art, a method of manufacturing a solar cell may require two or more targets and two or more sputtering guns during the formation of the window layer, such that a scale of the apparatus may become bigger and manufacture costs may become increased.

SUMMARY

Embodiments of the inventive concept may provide methods for manufacturing a solar cell capable of forming an intrinsic layer and a transparent electrode respectively having electric characteristics different from each other by a sputtering process using one target.

Embodiments of the inventive concept may also provide methods for manufacturing a solar cell capable of increasing or maximizing productivity.

According to embodiments of the inventive concepts, a method for manufacturing a solar cell may include: forming a lower electrode on a substrate; forming a light absorption layer on the lower electrode; forming a buffer layer on the light absorption layer; and forming a window layer on the buffer layer, the window layer including an intrinsic layer and the transparent electrode which have electric characteristics different from each other, respectively. The intrinsic layer and the transparent electrode may be formed by a sputtering process using a single target formed of metal oxide doped with impurities.

In some embodiments, the sputtering process may use oxygen gas and argon gas as a first reaction gas when the intrinsic layer is formed.

In other embodiments, the sputtering process may use hydrogen gas and the argon gas as a second reaction gas when the transparent electrode is formed.

In still other embodiments, the hydrogen gas may have a concentration of about 0.1% to about 1.0% in the second reaction gas.

In yet other embodiments, the hydrogen gas and the argon gas may be provided in a supplying flow rate of about 150 SCCM.

In yet still other embodiments, the metal oxide may include at least one of zinc oxide, indium oxide, and tin oxide.

In yet still other embodiments, the impurities may include at least one of gallium, indium, aluminum, boron, and molybdenum.

In yet still other embodiments, the impurities may have a weight ratio within a range of about 0.05 wt % to about 0.5 wt % in the single target.

In yet still other embodiments, the transparent electrode may have a resistivity of about $10^{-2}$ Ω-cm or less.

In yet still other embodiments, the transparent electrode may have a transmittance of about 93% or more.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
FIGS. 1 to 4 are cross-sectional views illustrating a method for manufacturing a solar cell according to embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

FIGS. 1 to 4 are cross-sectional views illustrating a method for manufacturing a solar cell according to embodiments of the inventive concept. FIG. 5 is a schematic view illustrating an apparatus forming a window layer of FIG. 4.

Referring to FIG. 1, a lower electrode 20 is formed on a substrate 10. The substrate 10 may be a sodalime glass substrate. Alternatively, the substrate 10 may be a ceramic substrate (e.g., alumina), a metal substrate (e.g., a stainless steel plate or a copper tape), or a polymer film. The lower electrode 20 may have low resistivity and excellent adhesiveness for preventing a peeling phenomenon caused by thermal expansion coefficient difference. In more detail, the lower electrode 20 may include molybdenum (Mo) formed by a sputtering process. The molybdenum may have high electric conductivity, ohmic contact formation characteristic with respect to another layer, and high stability at a high temperature under selenium atmosphere.

Figure 2:
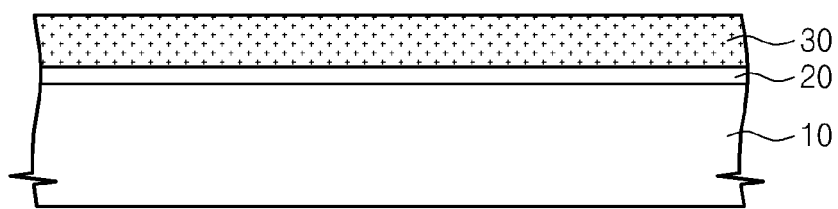

Referring to FIG. 2, a light absorption layer 30 is formed on the lower electrode 20. The light absorption layer 30 may generate electric energy from light energy by photoelectric effect. The light absorption layer 30 may include a chalcopyrite-based compound semiconductor selected from a group consisting of CuInSe, $CuInSe_2$, CuInGaSe, and $CuInGaSe_2$. The chalcopyrite-based compound semiconductor may be a P-type semiconductor and have an energy band gap of about 1.2 eV. The chalcopyrite-based compound semiconductor may be formed by a sputtering process or a co-evaporation method.

Figure 3:
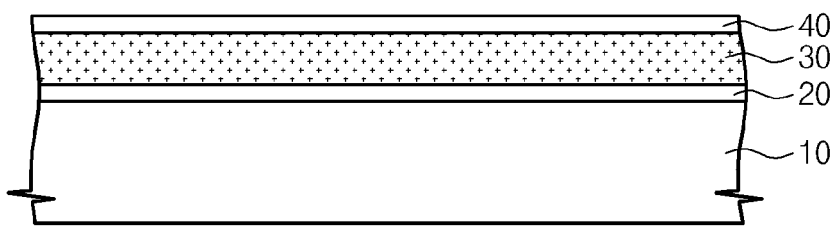

Referring to FIG. 3, a buffer layer 40 may be formed on the light absorption layer 30. The buffer layer 40 may have an energy band gap greater than that of the light absorption layer 30. For example, the buffer layer 40 may include cadmium sulfide (CdS) or zinc sulfide (ZnS) that may correspond to an N-type compound semiconductor. Cadmium sulfide (CdS) or zinc sulfide (ZnS) may be formed by a vacuum deposition method. Cadmium sulfide (CdS) may have an energy band gap of about 2.4 eV.

Figure 4:
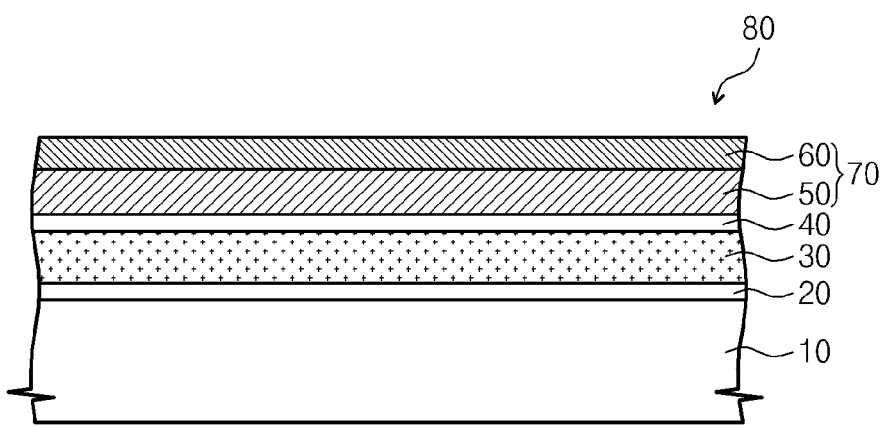
Figure 5:
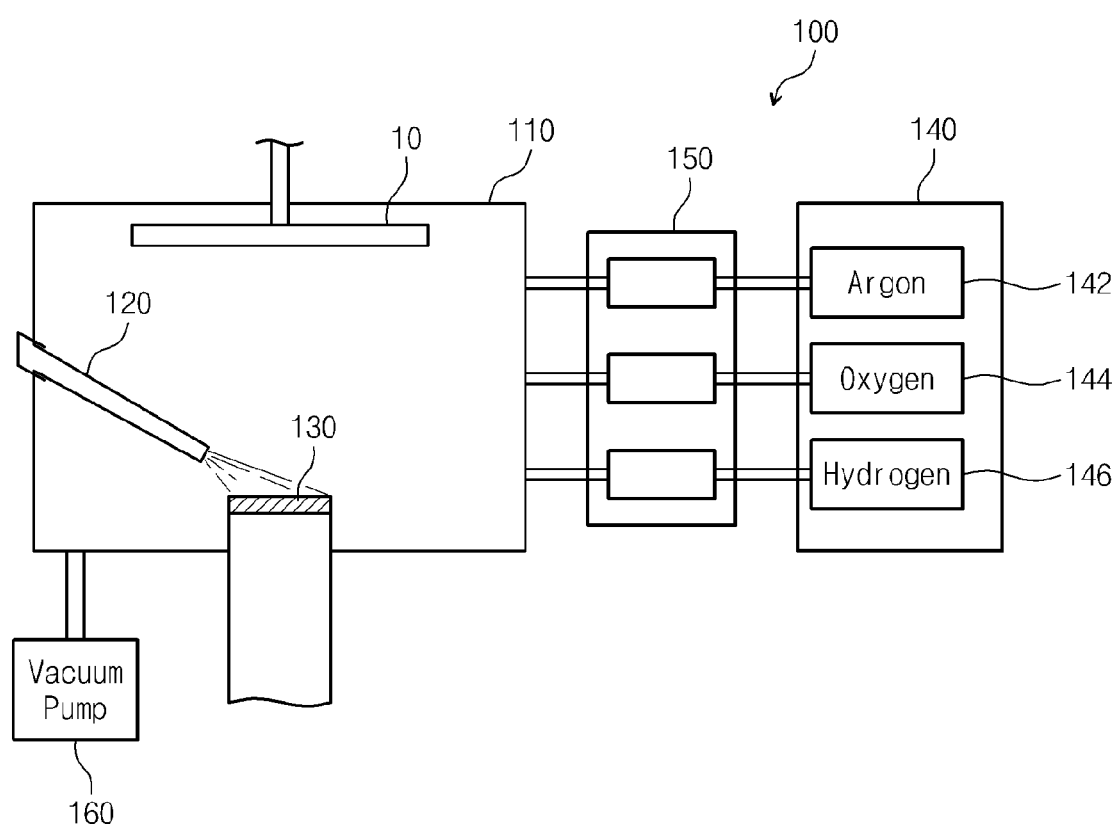
FIG. 5 is a schematic view illustrating an apparatus forming a window layer of FIG. 4.

Referring to FIGS. 4 and 5, a window layer 70 is formed on the buffer layer 40. The window layer 70 may include an intrinsic layer 50 and a transparent electrode 60 of which electric properties are different from each other. The intrinsic layer 50 may include an N-type metal oxide. The intrinsic layer 50 may be provided for increasing a life time of minority carries generated at a PN junction of the buffer layer 40 and the light absorption layer 30. The intrinsic layer 50 may have an energy band gap greater than that of the buffer layer 40. The transparent electrode 60 may include an N-type metal oxide having the same polarity as the intrinsic layer 50. For example, the intrinsic layer 50 and the transparent electrode 60 may include at least one metal oxide of zinc oxide, indium oxide, and tin oxide which have a wurtzite crystal structure. The zinc oxide may have an energy band gap of about 3.4 eV.

In other embodiments, the intrinsic layer 50 and the transparent electrode 60 may include metal oxide having impurities. The metal oxide may include at least one of zinc oxide, indium oxide, and tin oxide. The impurities may include at least one of gallium, molybdenum, aluminum, boron, and indium. The intrinsic layer 50 may include a doped oxide formed by combination of the impurities and oxygen. The doped oxide may exist as a dielectric impurity losing conductivity in the intrinsic layer 50. In other words, the intrinsic layer 50 may include two kinds of oxides including the metal oxide and the doped oxide. Thus, the intrinsic layer 50 may have a resistivity of about 1 MΩ-cm or more.

Meanwhile, the impurities may be combined with oxygen vacancies in the transparent electrode 60. The impurities combined with the oxygen vacancies may have electric conductivity. Thus, the transparent electrode 60 may have a resistivity of about $10^{-2}$ Ω-cm or less. Thus, the intrinsic layer 50 and the transparent electrode 60 may be formed by a sputtering process using the metal oxide including the impurities as a target 130 of FIG. 5.

Referring to FIG. 5, a sputtering apparatus 100 for the sputtering process may include a chamber 110, a target 130, a sputtering gun 120, a gas supplying part 140, a mass flow controller 150, and a vacuum pump 160. The chamber 110 may provide a space isolated from the outside thereof. The substrate 10 may be loaded in the space during the sputtering process. The vacuum pump 160 may provide a vacuum pressure into the inside of the chamber 110 by pumping. The sputtering gun 120 may be disposed to be adjacent to the target 130 and induce a plasma reaction of argon gas. The argon gas corresponding to an inert gas may lose electrons by a high frequency power outputted from the sputtering gun 120, so that the argon gas may be excited in positive ions and be accelerated from the sputtering gun 120 to the target 130. The target 130 may be a source constituting the window layer 70. For example, the target 130 may include metal oxide having the impurities. For example, the target 130 may include at least one of zinc oxide, indium oxide, and tin oxide which have the impurities including at least one of gallium, indium, aluminum, molybdenum, and boron. The impurities may have a weight ratio within a range of about 0.05 wt % to about 0.5 wt % and be doped into the metal oxide. The target 130 and the sputtering gun 120 may make a couple in the chamber 110. Here, one target 130 may be provided in the sputtering apparatus 100. Thus, the target 130 may be called as a single target.

The gas supplying part 140 may include an argon gas supplying part 142, an oxygen gas supplying part 144, and a hydrogen gas supplying part 146. Even though not shown in the drawings, the gas supplying part 140 may further include a purge gas supplying part supplying nitrogen gas. The mass flow controller 150 may include valves controlling supply of argon gas, supply of oxygen gas, and supply of hydrogen gas, respectively. The vacuum pump 160 may exhaust the gases supplied from the gas supplying part 140 from the inside of the chamber 110 to the outside of the chamber 110. The sputtering process of the intrinsic layer 50 and the transparent electrode 60 by the above apparatus will be described in detail hereinafter.

The intrinsic layer 50 may be formed by a sputtering process using a first reaction gas including the oxygen gas and the argon gas. The first reaction gas may flow into the chamber 110 through the gas supplying part 140 and the mass flow controller 150. The argon gas may induce plasma reaction. The oxygen gas used as an active gas may be mixed with the argon gas and then be supplied into the chamber 110. The oxygen gas may be combined with the impurities sputtered from the target 130, thereby generating the doped oxide. Thus, the intrinsic layer 50 may be formed of the metal oxide including the doped oxide.

The transparent electrode 60 may be formed by a sputtering process using the argon gas and the hydrogen gas as a second reaction gas. The hydrogen gas may have a mixture ratio of about 0.1% to about 1% in the second reaction gas. The hydrogen gas may disturb combination of the impurities sputtered from the target 130 and the oxygen gas remaining in the chamber 110. The hydrogen gas may generate oxygen vacancies of the impurities in the metal oxide of the transparent electrode 60. Mobility of charges may increase in the transparent electrode 60 due to the vacancies of the impurities, such that the transparent electrode 60 may have electric conductivity higher than that of the intrinsic layer 50.

Thus, the intrinsic layer 50 and the transparent electrode 60 may be sequentially formed by the sputtering process using the couple of the sputtering gun 120 and the target 130. The target 130 formed of the metal oxide including the impurities may reduce manufacture costs of the sputtering process. Generally, an intrinsic layer and a transparent electrode may be formed by a sputtering process using two couples of sputtering guns and targets. Additionally, a general sputtering process may use a metal oxide target and an impurity target to form a transparent electrode. The impurity target may be consumed in a ratio of about 1% to about 10% with respect to the metal oxide target during the sputtering process. However, according to embodiments of the inventive concept, the intrinsic layer 50 and the transparent electrode 60 may be formed by the sputtering process using the single target 130 formed of the metal oxide doped with the impurities. The single target 130 formed of the metal oxide including the impurities may exclude the consumption of the impurity target, such that the manufacture costs of the sputtering process may be reduced.

Thus, the method for manufacturing the solar cell according to embodiments of the inventive concept may increase or maximize productivity.

Figure 6:
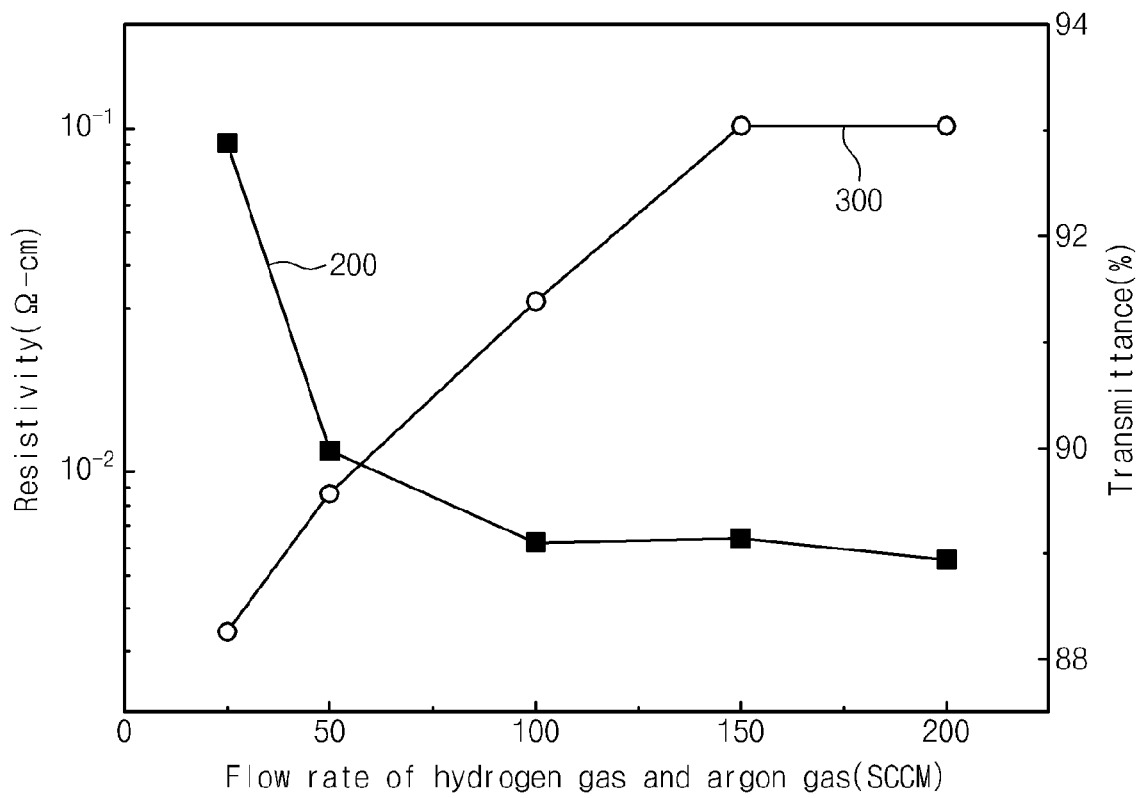
FIG. 6 is a graph illustrating resistivity and transmittance according to flow rates of a hydrogen gas and argon gas during formation of a transparent electrode of FIG. 4.

FIG. 6 is a graph illustrating resistivity and transmittance according to flow rates of a hydrogen gas and argon gas during formation of a transparent electrode of FIG. 4. In FIG. 6, a horizontal axis shows supplying flow rates of the hydrogen gas and the argon gas, and a vertical axis shows resistivity and transmittance.

Referring to FIGS. 4 to 6, as the supplying flow rates of the hydrogen gas and the argon gas become increased, the resistivity of the transparent electrode 60 may become decreased and the transmittance of the transparent electrode 60 may become increased. In FIG. 6, a reference numeral '200' shows variation of the resistivity of the transparent electrode 60 and a reference numeral '300' shows variation of the transmittance of the transparent electrode 60. For example, when the supplying flow rate of the hydrogen gas and the argon gas is about 50 SCCM, the transparent electrode 60 may have the resistivity of about $1\times10^{-2}$ Ω-cm and the transmittance of about 89.3%. Alternatively, when the supplying flow rate of the hydrogen gas and the argon gas is about 150 SCCM or about 200 SCCM, the transparent electrode 60 may have the resistivity of about $4\times10^{-3}$ Ω-cm and the transmittance of about 93% or more. According to embodiments of the inventive concept, when the supplying flow rate of the hydrogen gas and the argon gas is equal to or greater than about 150 SCCM, the transparent electrode 60 may have excellent electric conductivity and transmittance. Thus, the electric conductivity and the transmittance of the transparent electrode 60 may increase in proportion to the supplying flow rate of the hydrogen gas.

As a result, the method for manufacturing the solar cell according to the inventive concept may increase or maximize productivity.

According to embodiments of the inventive concept, the intrinsic layer and the transparent electrode respectively having the electric characteristics different from each other may be formed by the sputtering process using the single target of the metal oxide including the impurities. The intrinsic layer may be formed of the metal oxide having high resistivity by supplying the first reaction gas of the oxygen gas and the argon gas into the chamber. The intrinsic layer may include the metal oxide having the doped oxide formed by combination of the oxygen gas and the impurities. The transparent electrode may be formed of the metal oxide having the electric conductivity higher than that of the intrinsic layer by supplying the second reaction gas of the hydrogen gas and the argon gas into the chamber. The transparent electrode may be a metal oxide layer having oxygen vacancies generated by the hydrogen gas. Thus, by the sputtering process using the single target and the single sputtering gun, the intrinsic layer and the transparent electrode may be formed of the metal oxides having electric characteristics different from each other, respectively.

As a result, the method for manufacturing the solar cell according to embodiments of the inventive concept may increase or maximize productivity.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method for manufacturing a solar cell, comprising:
   forming a lower electrode on a substrate;
   forming a light absorption layer on the lower electrode;
   forming a buffer layer on the light absorption layer; and
   forming a window layer on the buffer layer, the window layer including an intrinsic layer and the transparent electrode which have electric characteristics different from each other, respectively,
   wherein the intrinsic layer and the transparent electrode are formed by a sputtering process using a single target formed of metal oxide doped with impurities, and
   wherein the sputtering process uses a first reaction gas when the intrinsic layer is formed and uses hydrogen gas and the argon gas as a second reaction gas when the transparent electrode is formed, and the hydrogen gas has a concentration of about 0.1% to about 1.0% in the second reaction gas.

2. The method of claim 1, wherein the sputtering process uses oxygen gas and argon gas as the first reaction gas.

3. The method of claim 1, wherein the hydrogen gas and the argon gas is provided in a supplying flow rate of about 150 SCCM.

4. The method of claim 1, wherein the metal oxide includes at least one of zinc oxide, indium oxide, and tin oxide.

5. The method of claim 4, wherein the impurities include at least one of gallium, indium, aluminum, boron, and molybdenum.

6. The method of claim 5, wherein the impurities have a weight ratio within a range of about 0.05 wt % to about 0.5 wt % in the single target.

7. A method for manufacturing a solar cell, comprising:
   forming a lower electrode on a substrate;
   forming a light absorption layer on the lower electrode;
   forming a buffer layer on the light absorption layer; and
   forming a window layer on the buffer layer, the window layer including an intrinsic layer and the transparent electrode which have electric characteristics different from each other, respectively,
   wherein the intrinsic layer and the transparent electrode are formed by a sputtering process using a single target formed of metal oxide doped with impurities, and
   wherein the transparent electrode has a resistivity of about $10^{-2}$ Ω-cm or less.

8. The method of claim 7, wherein the transparent electrode has a transmittance of about 93% or more.

* * * * *